US012596157B2

(12) United States Patent
Rang et al.

(10) Patent No.: US 12,596,157 B2
(45) Date of Patent: Apr. 7, 2026

(54) POWER SUPPLY-BASED COMMUNICATION FOR DETECTION OF A LACK OF REDUNDANCY IN POWER THAT HAS BEEN SUPPLIED TO A SYSTEM

(71) Applicant: Dell Products L.P., Round Rock, TX (US)

(72) Inventors: Anton Rang, Houlton, WI (US); Jonathan Walton, Seattle, WA (US)

(73) Assignee: Dell Products L.P., Round Rock, TX (US)

( * ) Notice: Subject to any disclaimer, the term of this patent is extended or adjusted under 35 U.S.C. 154(b) by 154 days.

(21) Appl. No.: 18/646,274

(22) Filed: Apr. 25, 2024

(65) Prior Publication Data

US 2025/0334647 A1 Oct. 30, 2025

(51) Int. Cl.
*G01R 31/40* (2020.01)
*G06F 1/26* (2006.01)

(52) U.S. Cl.
CPC ............. *G01R 31/40* (2013.01); *G06F 1/263* (2013.01)

(58) Field of Classification Search
CPC .......... G01R 31/40; G06F 1/263; G06F 11/16
See application file for complete search history.

(56) References Cited

U.S. PATENT DOCUMENTS

| | | | |
|---|---|---|---|
| 8,497,779 B1 | 7/2013 | Waide | |
| 9,912,164 B2 * | 3/2018 | Kumar | H02M 3/158 |
| 11,226,665 B2 * | 1/2022 | Messick | G06F 11/2015 |
| 2013/0049463 A1 * | 2/2013 | Shih | H02J 9/002 |
| | | | 307/23 |
| 2018/0352517 A1 | 12/2018 | Dauneria et al. | |
| 2021/0083505 A1 | 3/2021 | Beaston | |
| 2022/0043497 A1 | 2/2022 | Rathinasamy et al. | |
| 2022/0178975 A1 | 6/2022 | Prisco et al. | |
| 2023/0229223 A1 * | 7/2023 | Wolford | H05K 7/1492 |
| | | | 713/322 |

OTHER PUBLICATIONS

Rang, Anton. "Power Source Serialization, Detection, and Information Transmission" U.S. Appl. No. 18/336,273, filed Jun. 16, 2023, 46 pages.
"IEEE 1901" Wikipedia. [https://en.wikipedia.org/wiki/IEEE_1901], retrieved on Apr. 25, 2024, 7 pages.
"HomePlug" Wikipedia. [https://en.wikipedia.org/wiki/HomePlug], retrieved on Apr. 25, 2024, 8 pages.
Non-Final Office Action received for U.S. Appl. No. 18/336,273 dated Oct. 7, 2025, 24 pages.

* cited by examiner

*Primary Examiner* — Thang X Le
(74) *Attorney, Agent, or Firm* — Amin, Turocy & Watson, LLP

(57) ABSTRACT

Embodiments for power supply-based communication for detection of a lack of redundancy in power that has been supplied to a system are presented herein. A system generates first identification data to be transmitted from the system via a power connection between the system and a power source, in which the first identification data references a first unique identification corresponding to a first power supply of the system. Further, in response to a data transmission comprising second identification data referencing a second unique identification corresponding to a second power supply of the system being determined to be received via the power connection, the system determines a lack of redundancy in power that has been supplied to the system.

20 Claims, 9 Drawing Sheets

100

POWER SOURCE 102

POWER CONNECTION 104

POWER CONSUMING SYSTEM 110

GROUP OF POWER SUPPLIES 120

POWER CONNECTION 106

POWER SOURCE 108

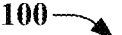
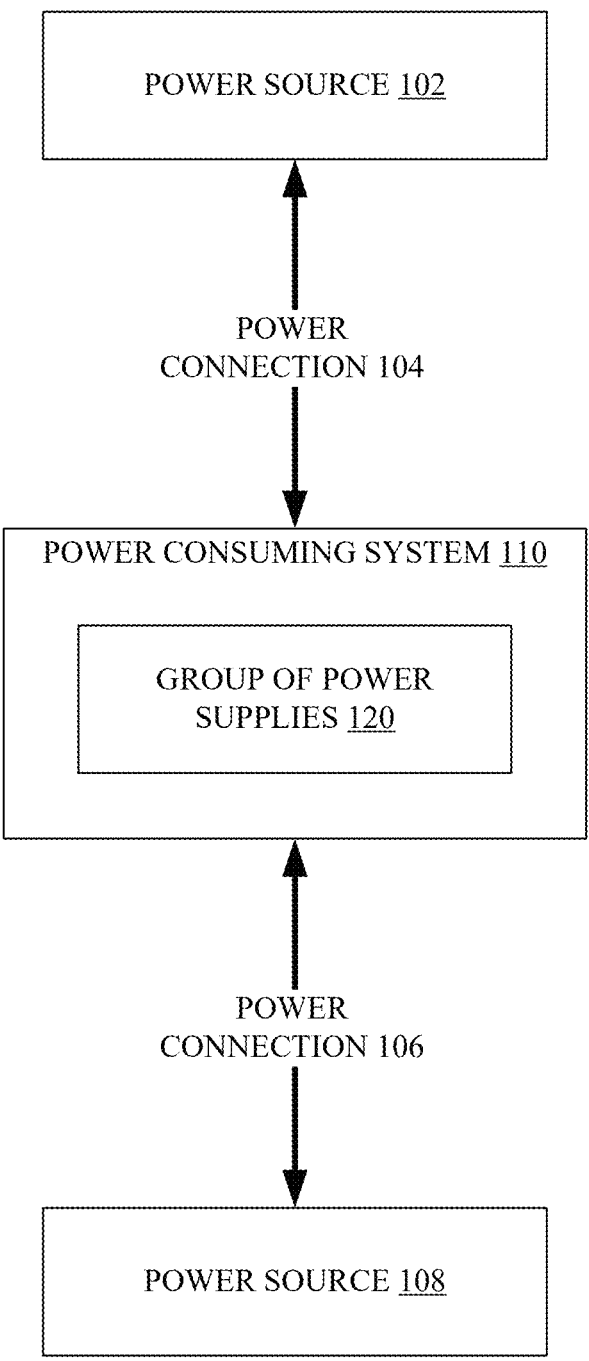
FIG. 1

200 ⤵

300 ⟶

400

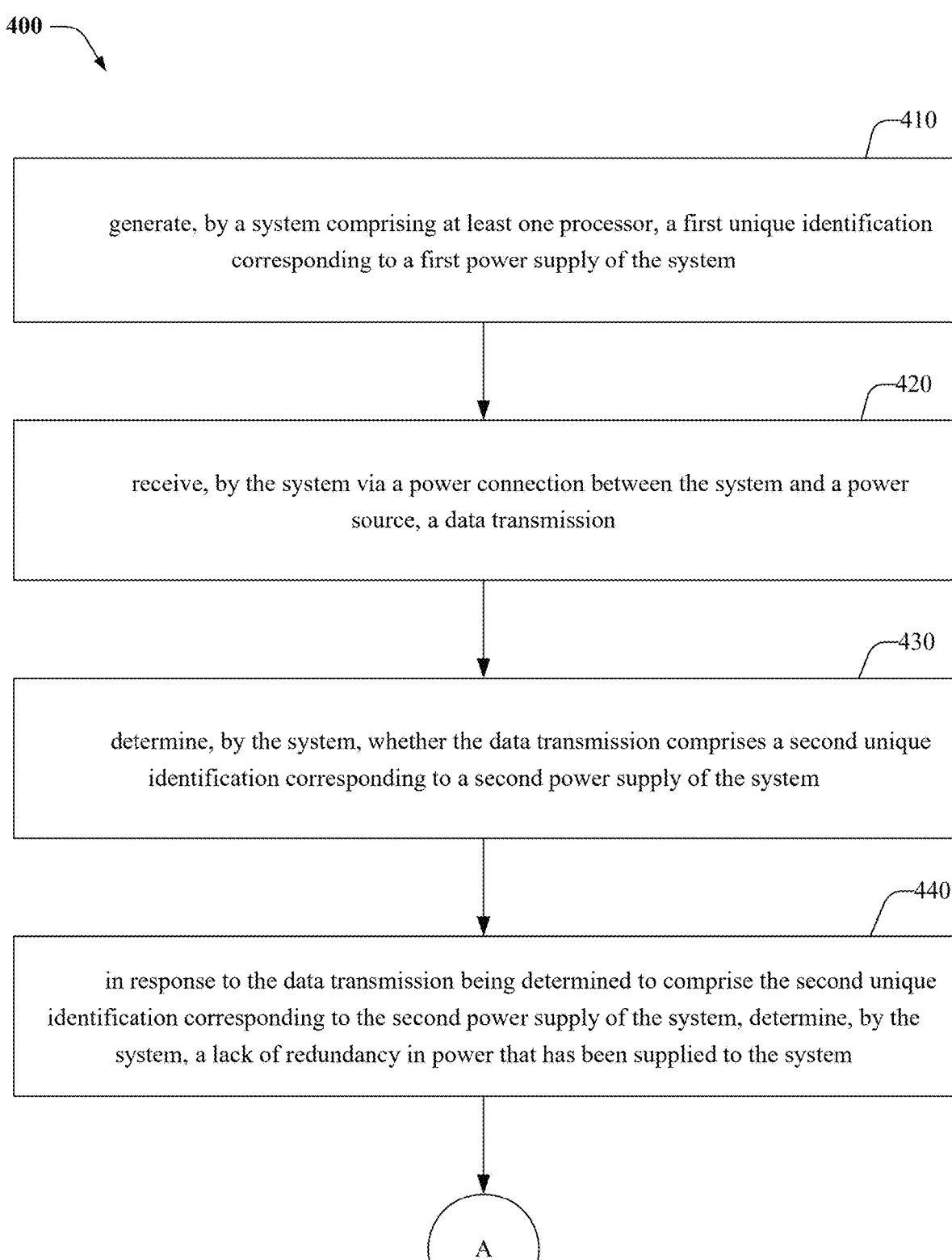

410 generate, by a system comprising at least one processor, a first unique identification corresponding to a first power supply of the system

420 receive, by the system via a power connection between the system and a power source, a data transmission

430 determine, by the system, whether the data transmission comprises a second unique identification corresponding to a second power supply of the system

440 in response to the data transmission being determined to comprise the second unique identification corresponding to the second power supply of the system, determine, by the system, a lack of redundancy in power that has been supplied to the system

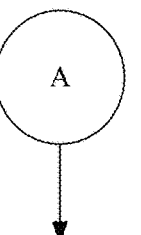

in response to the data transmission being determined to comprise the second identification data referencing the second unique identification corresponding to the second power supply, determine, by the system, that the power source supplies, via the power connection, a first portion of the power to the second power supply and a second portion of the power to the first power supply in response to the lack of redundancy in power that has been supplied to the system being determined, send, by the system, a message directed to a device indicating the lack of redundancy in power that has been supplied to the system

FIG. 5

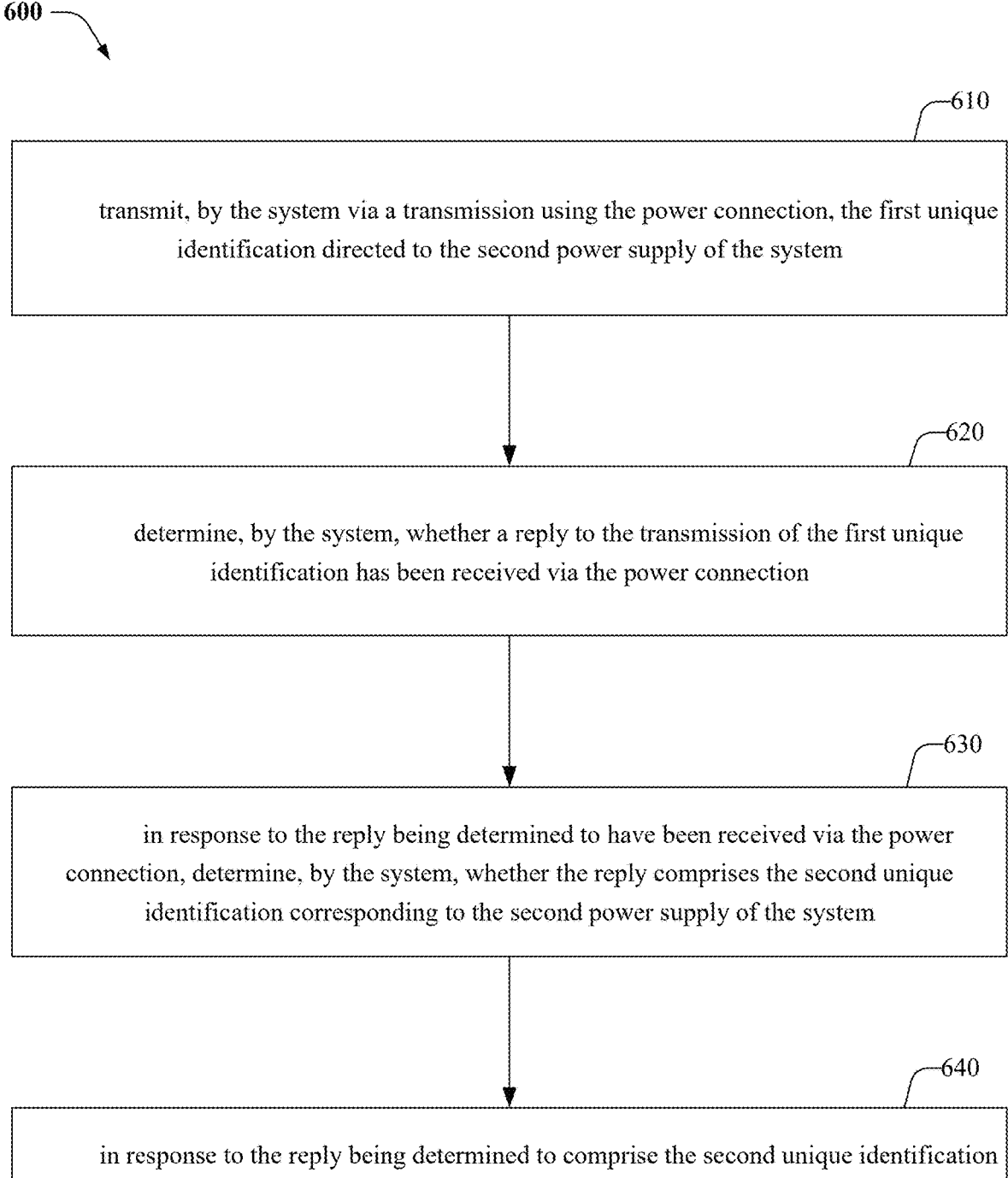

600

610 transmit, by the system via a transmission using the power connection, the first unique identification directed to the second power supply of the system

620 determine, by the system, whether a reply to the transmission of the first unique identification has been received via the power connection

630 in response to the reply being determined to have been received via the power connection, determine, by the system, whether the reply comprises the second unique identification corresponding to the second power supply of the system

640 in response to the reply being determined to comprise the second unique identification corresponding to the second power supply of the system, determine, by the system, the lack of redundancy in power that has been supplied to the system

FIG. 6

700

┌─ 710 generate, by a system comprising at least one processor, first data representing the system or a first power supply of the system

┌─ 720 in response to second data representing a second power supply of the system being determined to be received via a power connection between a power source and the system, determine, by the system, a lack of redundancy in power that has been supplied to the system, in which the lack of redundancy in power has been determined in response to a determination, based on the second data, that the power source supplies, via the power connection, a first portion of the power to the first power supply of the system and a second portion of the power to the second power supply of the system

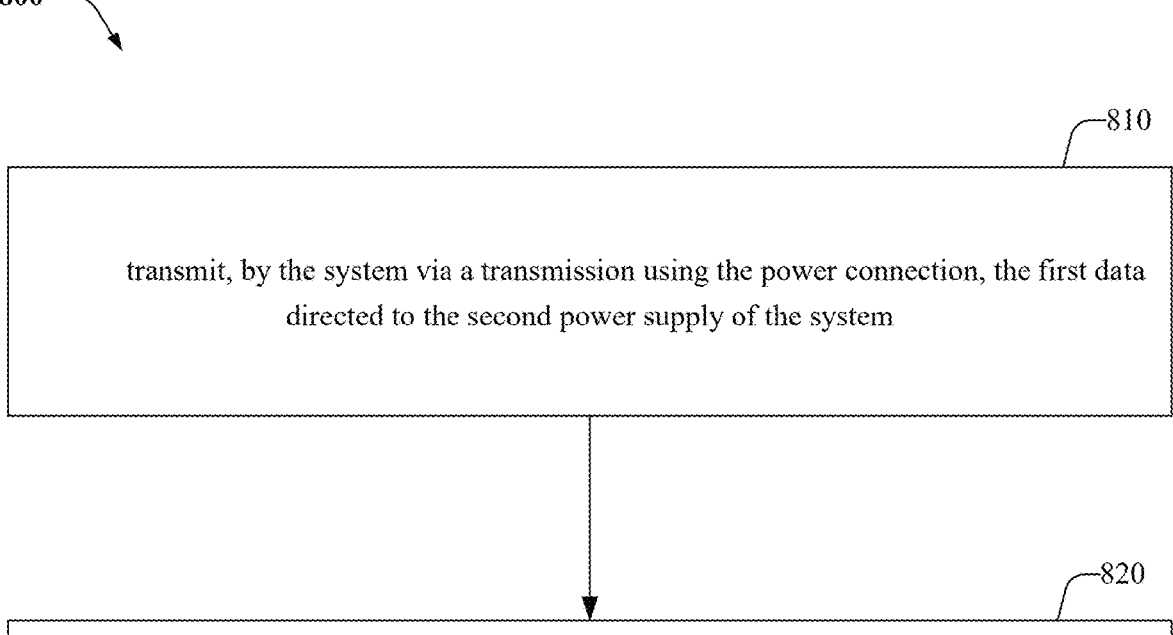

810 transmit, by the system via a transmission using the power connection, the first data directed to the second power supply of the system

820 in response to a response to the transmission of the first data -the response comprising the second data - being determined to be received, determine, by the system, the lack of redundancy in power that has been supplied to the system, in which the lack of redundancy in power has been determined in response to a determination, based on the second data, that the power source supplies, via the power connection, a first portion of the power to the first power supply of the system and a second portion of the power to the second power supply of the system

FIG. 8

POWER SUPPLY-BASED COMMUNICATION FOR DETECTION OF A LACK OF REDUNDANCY IN POWER THAT HAS BEEN SUPPLIED TO A SYSTEM

TECHNICAL FIELD

The subject disclosure generally relates to embodiments for power supply-based communication for detection of a lack of redundancy in power that has been supplied to a system.

BACKGROUND

A piece of equipment designed to connect to redundant power sources can be mis-wired such that the expected power redundancy is not present. For instance, a rack-mounted computer system with two power supplies can have a cable of each of the power supplies connected to the same power source, rather than having each cable of the power supplies connected to different power sources.

BRIEF DESCRIPTION OF THE DRAWINGS

Non-limiting embodiments of the subject disclosure are described with reference to the following Figures, in which like reference numerals refer to like parts throughout the various views unless otherwise specified:

FIG. 1 illustrates a block diagram of a system environment in which the system can perform power supply-based communication for detection of a lack of redundancy in power that has been supplied to the system, in accordance with various example embodiments;

FIGS. 4-5 illustrate flow charts of a method associated with a system that can perform power supply-based communication to detect a lack of redundancy in power that has been supplied to the system based on a data transmission that is received via a power connection of the system, in accordance with various example embodiments;

FIG. 6 illustrates a flow chart of a method associated with a system that can perform power supply-based communication to detect a lack of redundancy in power that has been supplied to the system based on a reply to a transmission from the system that is received via a power connection of the system, in accordance with various example embodiments;

FIG. 7 illustrates a flow chart of another method associated with a system that can perform power supply-based communication to detect a lack of redundancy in power that has been supplied to the system based on data that is received via a power connection of the system, in accordance with various example embodiments;

FIG. 8 illustrates a flow chart of another method associated with a system that can perform power supply-based communication to detect a lack of redundancy in power that has been supplied to the system based on a reply to a transmission from the system that is received via a power connection of the system, in accordance with various example embodiments.

DETAILED DESCRIPTION

Figure 2:
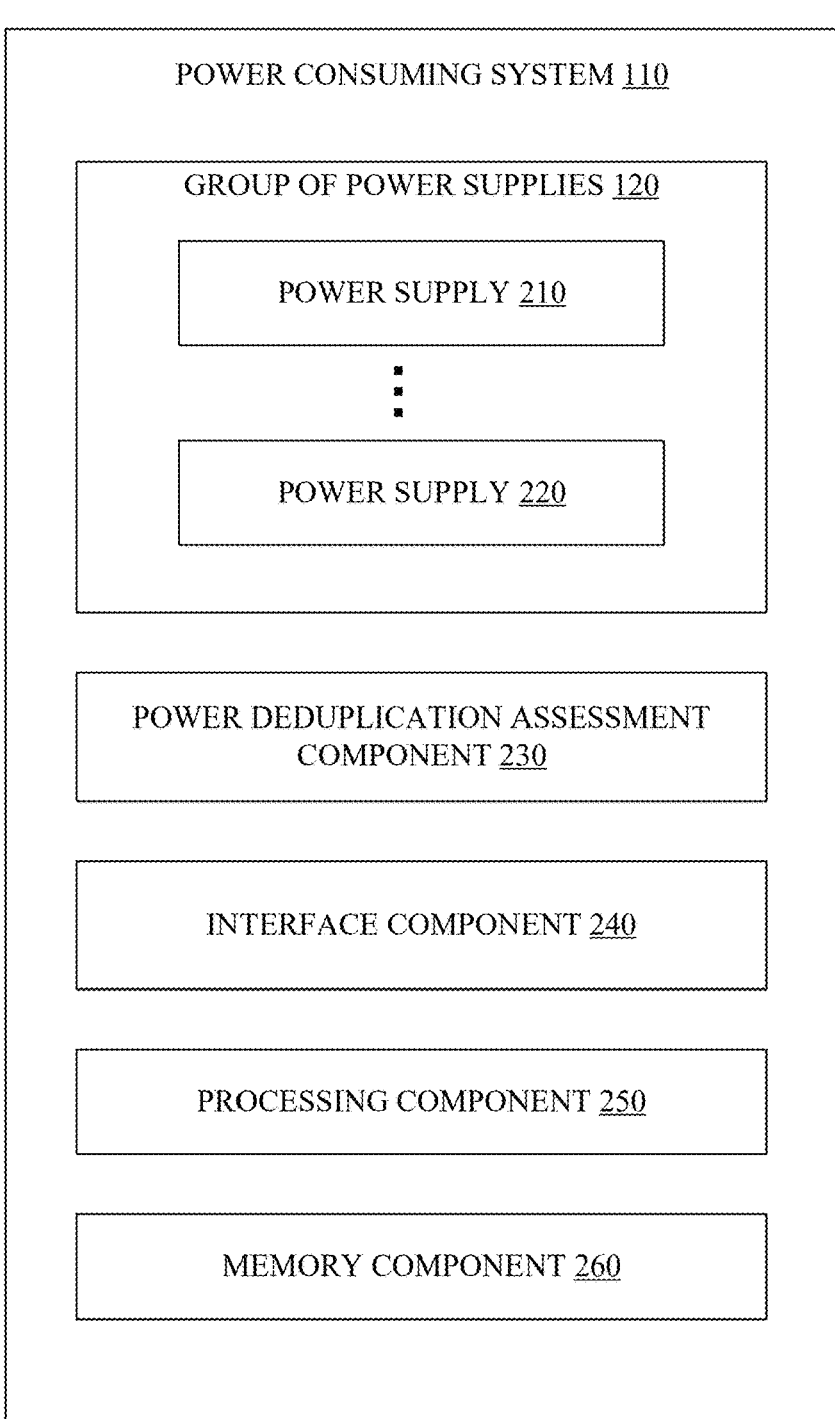
FIG. 2 illustrates a block diagram of a system that can perform power supply-based communication for detection of a lack of redundancy in power that has been supplied to the system, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, an equipment designed to connect to redundant power sources can be mis-wired such that expected power redundancy is not present, e.g., each power cable of respective power supplies of the equipment being connected to the same power source. In various embodiments described herein, a power consuming device, e.g., power consuming system, can perform power supply-based communication to detect a lack of redundancy in power that has been supplied to the power consuming system.

For example, in an embodiment, a system (e.g., power consuming system, power consuming device) comprises at least one processor; and at least one memory that stores executable instructions that, when executed by the at least one processor, facilitate performance of operations by the system, the operations comprising: generating first identification data to be transmitted from the system via a power connection between the system and a power source, in which the first identification data references a first unique identification corresponding to a first power supply of the system; and in response to receiving, via the power connection, a data transmission comprising second identification data referencing a second unique identification corresponding to a second power supply of the system, determining a lack of redundancy in power that has been supplied to the system.

In one embodiment, the receiving of the data transmission comprises: receiving the data transmission via demodulation of a load of the system; receiving the data transmission based on a defined frequency that is different from a power frequency of the power that has been supplied to the system; or receiving the data transmission utilizing a broadband over power line-based communication protocol.

In another embodiment, the power source supplies, via the power connection (e.g., utilizing an alternating current voltage source or a direct current voltage source), a first portion of the power to the first power supply; and the determining of the lack of redundancy in power comprises: in response to the data transmission being determined to comprise the second identification data referencing the second unique identification corresponding to the second power supply, determining that the power source supplies, via the power connection, a second portion of the power to the second power supply.

In yet another embodiment, the operations further comprise sending an indication of the lack of redundancy in power that has been supplied to the system directed to a device to facilitate a correction of the lack of redundancy in power, e.g., the indication comprises a message comprising the second identification data referencing the second unique identification corresponding to the second power supply.

In an embodiment, the power source is a first power source, the power connection is a first power connection, the power is first power, and the operations further comprise: performing the correction of the lack of redundancy in power by supplying, by a second power source that is different from the first power source (e.g., utilizing an alternating current (AC) voltage source or a direct current (DC) voltage source), second power to the first power supply via a second power connection that is different from the first power connection, or by supplying, by the second power source, the second power to the second power supply via the second power connection, in which the second power connection is between the second power source and the first power supply or the second power supply.

In one embodiment, the determining of the lack of redundancy in power is a first determining of the lack of redundancy in power, and the operations further comprise: transmitting, via the power connection, the first identification data directed to the second power supply; and in response to receiving, via the power connection, a reply to the transmitting of the first identification data comprising the second identification data referencing the second unique identification corresponding to the second power supply, second determining the lack of redundancy in power that has been supplied to the system.

In another embodiment, the power source supplies, via the power connection, a first portion of the power to the first power supply, and the second determining of the lack of redundancy in power comprises: in response to the reply to the transmitting of the first identification data being determined to comprise the second identification data referencing the second unique identification corresponding to the second power supply, determining that the power source supplies, via the power connection, a second portion of the power to the second power supply.

In yet another embodiment, the transmitting of the first identification data comprises: modulating a load of the system to perform the transmitting of the first identification data; transmitting the first identification data based on a defined frequency that is different from a power frequency of the power that has been supplied to the system; or transmitting the first identification data utilizing a broadband over power line-based communication protocol.

In an embodiment, a method comprises: generating, by a system (e.g., power consuming system, power consuming device) comprising at least one processor, a first unique identification corresponding to a first power supply of the system; receiving, by the system via a power connection between the system and a power source, a data transmission; determining, by the system, whether the data transmission comprises a second unique identification corresponding to a second power supply of the system; and in response to the data transmission being determined to comprise the second unique identification corresponding to the second power supply of the system, determining, by the system, a lack of redundancy in power that has been supplied to the system.

In one embodiment, the receiving of the data transmission comprises: receiving the data transmission via demodulation of a load of the system; receiving the data transmission based on a defined frequency that is different from a power frequency of the power that has been supplied to the system; or receiving the data transmission utilizing a broadband over power line-based communication protocol.

In another embodiment, the method further comprises in response to the determining of the lack of redundancy in power that has been supplied to the system, sending, by the system, a message directed to a device indicating the lack of redundancy in power that has been supplied to the system.

In yet another embodiment, the power source supplies, via the power connection, a first portion of the power to the first power supply, and the determining of the lack of redundancy in power comprises: in response to the data transmission being determined to comprise the second identification data referencing the second unique identification corresponding to the second power supply, determining that the power source supplies, via the power connection, a second portion of the power to the second power supply.

In an embodiment, the determining of the lack of redundancy in power is a first determining of the lack of redundancy in power, and the method further comprises: transmitting, by the system via the power connection, the first unique identification directed to a second power supply of the system; determining, by the system, whether a reply to the transmitting of the first unique identification has been received via the power connection; in response to the reply being determined to have been received via the power connection, determining, by the system, whether the reply comprises the second unique identification corresponding to the second power supply of the system; and in response to the reply being determined to comprise the second unique identification corresponding to the second power supply of the system, second determining, by the system, the lack of redundancy in power that has been supplied to the system.

In one embodiment, the power source supplies, via the power connection, a first portion of the power to the first power supply, and the second determining of the lack of redundancy in power comprises: in response to the reply being determined to comprise the second identification corresponding to the second power supply of the system, determining that the power source supplies, via the power connection, a second portion of the power to the second power supply.

In another embodiment, the transmitting of the first unique identification comprises: modulating a load of the system to perform the transmitting of the first unique identification; performing the transmitting of the first unique identification based on a defined frequency that is different from a power frequency of the power that has been supplied to the system; or transmitting the first unique identification utilizing a broadband over power line-based communication protocol.

In yet another embodiment, the method further comprises receiving, by the system via the power connection, the reply via demodulation of a load of the system; receiving, by the system via the power connection, the reply based on a defined frequency that is different from a power frequency of the power that has been supplied to the system; or receiving, by the system via the power connection, the reply utilizing a broadband over power line-based communication protocol.

In an embodiment, a non-transitory machine-readable medium comprises instructions that, in response to execution, cause a system (e.g., power consuming system, power consuming device) comprising at least one processor to perform operations, the operations comprising: generating first data representing the system or a first power supply of the system; and in response to receiving, via a power connection between a power source and the system, second data representing a second power supply of the system, determining a lack of redundancy in power that has been supplied to the system, in which the determining of the lack of redundancy in power comprises determining that the power source supplies, via the power connection, a first portion of the power to the first power supply of the system and a second portion of the power to the second power supply of the system.

In one embodiment, the determining of the lack of redundancy in power is a first determining of the lack of redundancy in power, and the operations further comprise: transmitting, via the power connection, the first data directed to the second power supply of the system; and in response to a response to the transmission of the first data comprising the second data being determined to be received, second determining the lack of redundancy in power that has been supplied to the system, wherein the second determining of the lack of redundancy in power comprises determining, based on the second data, that the power source supplies, via the power connection, the first portion of the power to the first power supply of the system and the second portion of the power to the second power supply of the system.

Figure 3:
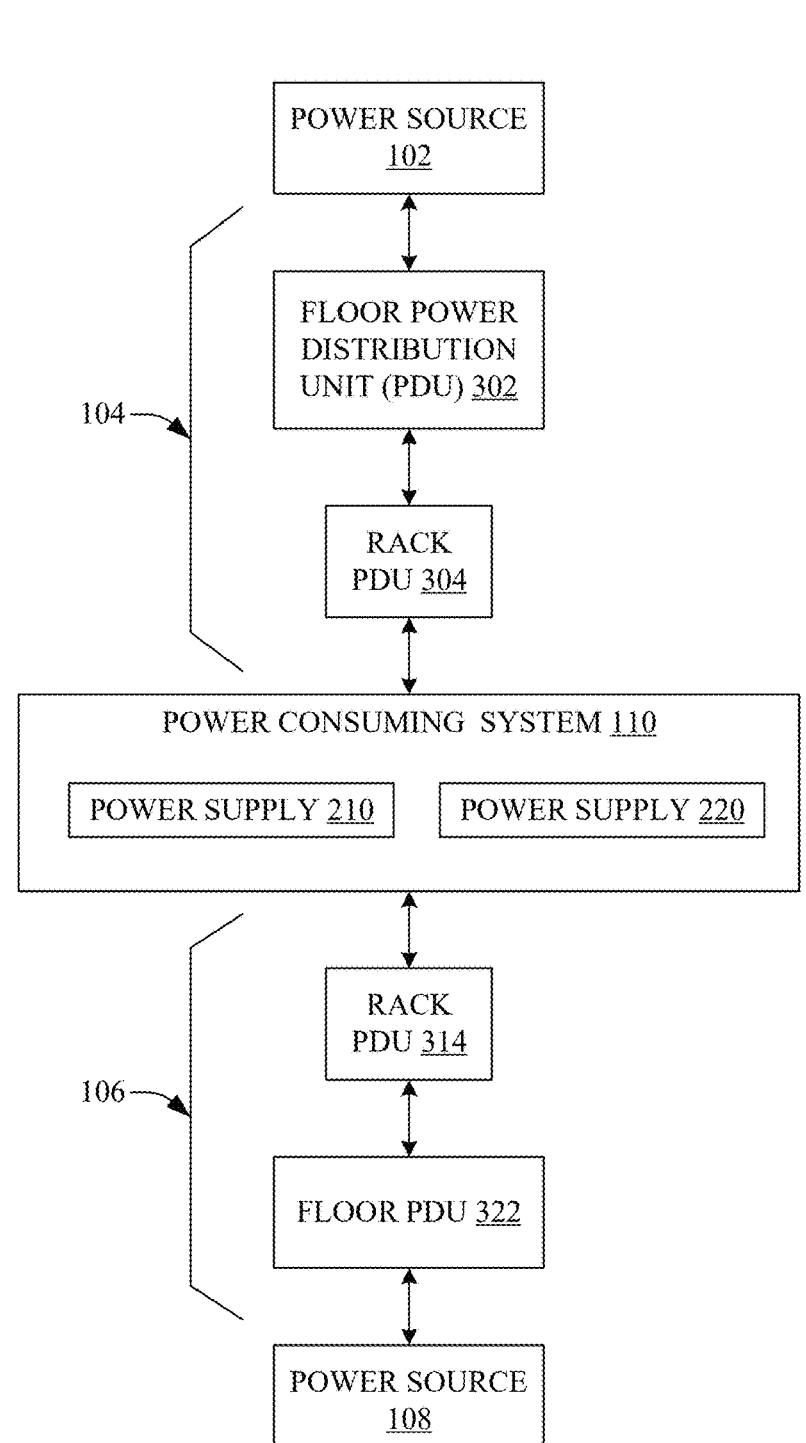
FIG. 3 illustrates a block diagram of a system environment comprising respective power connections that comprise at least one floor power distribution unit or a rack PDU, in accordance with various example embodiments.

Now referring to FIGS. 1-3, a power consuming device, e.g., power consuming system 110 (e.g., compute server, data server, data storage unit, device corresponding to a data center) of a system environment (100) can perform power supply-based communication(s) via a power connection (e.g., 104, 106) to detect a lack of redundancy in power that has been supplied to the power consuming system.

The power consuming system comprises a group of power supplies (120) comprising at least two power supplies (210, 220); a power deduplication assessment component (230); an interface component (240), a processing component (250), and a memory component (260). In embodiment(s), the memory component stores executable instructions that, when executed by the processing component, facilitate performance of operations by the power consuming system, e.g., via the group of power supplies, the power deduplication assessment component, and the interface component.

In an embodiment, the power consuming system generates first identification data to be transmitted from the power consuming system via a power connection (e.g., 104, 106) between the power consuming system and a power source (e.g., 102, 108)—the first identification data referencing a first unique identification corresponding to a first power supply (e.g., 210, 220) of the group of power supplies of the power consuming system. In one embodiment, the first identification data comprises a serial number that references the first power supply and/or the power consuming system.

Further, in response to receiving, via the power connection, a data transmission comprising second identification data referencing a second unique identification corresponding to a second power supply (e.g., 220, 210) of the power consuming system, the power consuming system determines a lack of redundancy in power that has been supplied to the power consuming system. In an embodiment, the second identification data, e.g., a serial number, references the second power supply and/or the power consuming system.

In embodiment(s), the power source comprises an AC voltage source (e.g., 110-230 VAC voltage source) and/or a DC voltage source, e.g., 48 VDC, e.g., a telecommunication (telco) voltage source.

In other embodiment(s), a power supply of the group of power supplies receives, via the power connection, power from the power source and converts the power to a low DC voltage, e.g., 1 to 12 V, for powering devices and/or components of the power consuming system.

In an embodiment, the power deduplication assessment component can obtain, e.g., via an Inter-Integrated Circuit (I2C) communication protocol or other serial communication protocol, the first unique identification from the first power supply and the second unique identification from the second power supply. Further, in response to obtaining the first unique identification and the second unique identification, the power deduplication assessment component can generate the first identification data and the second identification data.

In turn, in embodiment(s), the power deduplication assessment component can receive, via the power connection, the data transmission. In an embodiment, the power deduplication assessment component can receive the data transmission via demodulation of a load of the power consuming system. In one embodiment, the power deduplication assessment component, can receive the data transmission based on a defined frequency, e.g., carrier frequency, that is different from a power frequency of the power that has been supplied to the power consuming system. In another embodiment, the power deduplication assessment component can receive the data transmission utilizing a broadband over power line-based communication protocol.

In embodiment(s), the power source (e.g., 102, 108) supplies, via the power connection (e.g., 104, 106), a first portion of the power to the first power supply (e.g., 210, 220), and in response to the data transmission being determined, by the power deduplication assessment component, to comprise the second identification data referencing the second unique identification corresponding to the second power supply, the power deduplication assessment component determines that the power source supplies, via the power connection, a second portion of the power to the second power supply, e.g., indicating a lack of redundancy in power that has been supplied to the power consuming system, e.g., indicating that a power source supplies, via the power connection, power to more than one power supply of the group of power supplies.

In embodiment(s), the interface component can send an indication of the lack of redundancy in power that has been supplied to the power consuming system directed to a device (not shown), e.g., communicatively coupled to the power consuming system, to facilitate a correction of the lack of redundancy in power via an administrator of the power consuming system. For example, in an embodiment, the interface component can send a message comprising the second identification data referencing the second unique identification corresponding to the second power supply directed to the device to facilitate the correction of the lack of redundancy in power.

In one embodiment, the interface component can generate a signal, e.g., light-based signal, which can be emitted, e.g., via a light emitting diode (not shown) of the power consuming system, to indicate the lack of redundancy in power. In another embodiment, the interface component can generate a sound-based signal, which can be emitted, e.g., via a speaker (not shown) of the power consuming system, to indicate the lack of redundancy in power.

In embodiment(s), the power source is a first power source (e.g., 102), the power connection is a first power connection (e.g., 104), the power is first power, and a performance of the correction of the lack of redundancy in power comprises supplying, by a second power source (e.g., 108) that is different from the first power source, second power to the first power supply (e.g., 210) via a second power connection (e.g., 106) that is different from the first power connection; or supplying, by the second power source, the second power to the second power supply (e.g., 220) via the second power connection.

In other embodiment(s), the power deduplication assessment component can transmit, via a data transmission utilizing the power connection, the first identification data directed to the second power supply; and in response to receiving, via the power connection, a reply to the data transmission comprising the second identification data referencing the second unique identification corresponding to the second power supply, the power deduplication assessment component determines the lack of redundancy in power that has been supplied to the power consuming system.

For example, in embodiment(s), the power source (e.g., 102, 108) supplies, via the power connection (e.g., 104, 106), a first portion of the power to the first power supply (e.g., 210, 220), and in response to the reply to the data transmission being determined, by the power deduplication assessment component, to comprise the second identification data referencing the second unique identification corresponding to the second power supply, the power deduplication assessment component determines that the power source supplies, via the power connection, a second portion of the power to the second power supply, e.g., indicating a lack of redundancy in power that has been supplied to the power consuming system, e.g., indicating that the power source supplies, via the power connection, power to more than one power supply of the group of power supplies of the power consuming system.

In one embodiment, the power deduplication assessment component can transmit the first identification data by modulating a load of the power consuming system.

In another embodiment, the power deduplication assessment component can transmit the first identification data based on a defined frequency that is different from a power frequency of the power that has been supplied to the power consuming system.

In yet another embodiment, the power deduplication component can transmit the first identification data utilizing a broadband over power line-based communication protocol.

In embodiment(s), the power deduplication assessment component can receive the reply to the data transmission via demodulation of a load of the power consuming system; based on a defined frequency that is different from a power frequency of the power that has been supplied to the power consuming system; or utilizing a broadband over power line-based communication protocol.

Referring now to embodiment(s) illustrated by FIG. 3, the power connection (e.g., 104, 106) comprises respective power connections between the first power source and the second power source. In this regard, the respective power connections comprising at least one floor power distribution unit (PDU) (e.g., 302, 322) (e.g., comprising a power strip, power cables, and/or an extension cord) and/or at least one rack PDU (304, 314). In embodiment(s), the rack PDU can comprise a tower/structure, e.g., metal cage, which can be secured to a floor, and one or more power consuming systems (e.g., 110) can be attached to the rack PDU, e.g., via shelves that respective chassis comprising the power consuming system(s) can be plugged into.

FIGS. 4-8 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

FIGS. 4-5 illustrate flow charts (400, 500) of a method associated with a system (110) that can perform power supply-based communication to detect a lack of redundancy in power that has been supplied to the system based on a data transmission that is received via a power connection of the system, in accordance with various example embodiments.

At 410, the system generates a first unique identification corresponding to a first power supply of the system.

At 420, the system receives, via a power connection between the system and a power source, a data transmission.

At 430, the system determines whether the data transmission comprises a second unique identification corresponding to a second power supply of the system.

At 440, in response to the data transmission being determined to comprise the second unique identification corresponding to the second power supply of the system, the system determines a lack of redundancy in power that has been supplied to the system.

At 510, in response to the data transmission being determined to comprise the second identification data referencing the second unique identification corresponding to the second power supply, the system determines that the power source supplies, via the power connection, a first portion of the power to the second power supply and a second portion of the power to the first power supply.

At 520, in response to the lack of redundancy in power that has been supplied to the system being determined, the system sends a message directed to a device indicating the lack of redundancy in power that has been supplied to the system.

FIG. 6 illustrates a flow chart (600) of a method associated with a system (110) that can perform power supply-based communication to detect a lack of redundancy in power that has been supplied to the system based on a reply to a transmission from the system that is received via a power connection of the system, in accordance with various example embodiments.

At 610, the system transmits, vis a transmission using the power connection, the first unique identification directed to the second power supply of the system.

At 620, the system determines whether a reply to the transmission of the first unique identification has been received via the power connection.

At 630, in response to the reply being determined to have been received via the power connection, the system determines whether the reply comprises the second unique identification corresponding to the second power supply of the system.

At 640, in response to the reply being determined to comprise the second unique identification corresponding to the second power supply of the system, the system determines the lack of redundancy in power that has been supplied to the system.

FIG. 7 illustrates a flow chart (700) of another method associated with a system (110) that can perform power supply-based communication to detect a lack of redundancy in power that has been supplied to the system based on data that is received via a power connection of the system, in accordance with various example embodiments.

At 710, the system generates first data representing the system or a first power supply of the system.

At 720, in response to second data representing a second power supply of the system being determined to be received via a power connection between a power source and the system, the system determines a lack of redundancy in power that has been supplied to the system, in which the lack of redundancy in power has been determined in response to a determination, based on the second data, that the power source supplies, via the power connection, a first portion of the power to the first power supply of the system and a second portion of the power to the second power supply of the system.

FIG. 8 illustrates a flow chart (800) of another method associated with a system (110) that can perform power supply-based communication to detect a lack of redundancy in power that has been supplied to the system based on a reply to a transmission from the system that is received via a power connection of the system, in accordance with various example embodiments.

At 810, the system transmits, via a transmission using the power connection, the first data directed to the second power supply of the system.

At 820, in response to a response/reply to the transmission of the first data—the response/reply comprising the second data-being determined to be received, determine, by the system, the lack of redundancy in power that has been supplied to the system, in which the lack of redundancy in power has been determined in response to a determination, based on the second data, that the power source supplies, via the power connection, a first portion of the power to the first power supply of the system and a second portion of the power to the second power supply of the system.

Reference throughout this specification to "one embodiment," "an embodiment," "another embodiment", "yet another embodiment", "embodiment(s)", "other "embodiment(s)", and "yet other embodiment(s)" means that a particular feature, structure, or characteristic described in connection with the embodiment is included in at least one embodiment. Thus, the appearances of the phrase "in one embodiment," "in an embodiment," "in another embodiment", "in yet another embodiment", "in embodiment(s)", "in other embodiment(s)", and "in yet other embodiment(s)" in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word-without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, terms "component", "system", and the like are intended to refer to a computer-related entity, hardware, software (e.g., in execution), middleware, and/or firmware. For example, a component can be a processor, a process running on a processor, an object, an executable, a program, a storage device, and/or a computer. By way of illustration, an application running on a server, client, etc. and the server, client, etc. can be a component. One or more components can reside within a process, and a component can be localized on one computer and/or distributed between two or more computers.

Further, components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. In yet another example, a component can be an apparatus that provides specific functionality through electronic components without mechanical parts; the electronic components can comprise one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can comprise, but are not limited to: random access memory (RAM); read only memory (ROM); electrically erasable programmable read only memory (EEPROM); flash memory or other memory technology (e.g., card, stick, key drive, thumb drive, smart card); solid state drive (SSD) or other solid-state storage technology; optical disk storage (e.g., compact disk (CD) read only memory (CD ROM), digital video/versatile disk (DVD), Blu-ray disc); cloud-based (e.g., Internet based) storage; magnetic storage (e.g., magnetic cassettes, magnetic tape, magnetic disk storage or other magnetic storage devices); a virtual device that emulates a storage device and/or any of the above computer-readable media; or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

As it is employed in the subject specification, the term "processing component" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "data storage", "memory component", and substantially any other information storage component relevant to operation and functionality of a system, component, and/or process, can refer to "memory components," or entities embodied in a "memory," or components comprising the memory. It will be appreciated that the memory components described herein can be either volatile memory or nonvolatile memory, or can comprise both volatile and nonvolatile memory.

By way of illustration, and not limitation, nonvolatile memory, for example, can be included in a memory component (260), non-volatile memory 922 (see below), disk storage 924 (see below), and/or memory storage 946 (see below). Further, nonvolatile memory can be included in read only memory (ROM), programmable ROM (PROM), electrically programmable ROM (EPROM), electrically erasable ROM (EEPROM), or flash memory. Volatile memory (e.g., 920) can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DR-RAM). Additionally, the disclosed memory components of systems or methods herein are intended to comprise, without being limited to comprising, these and any other suitable types of memory.

Figure 9:
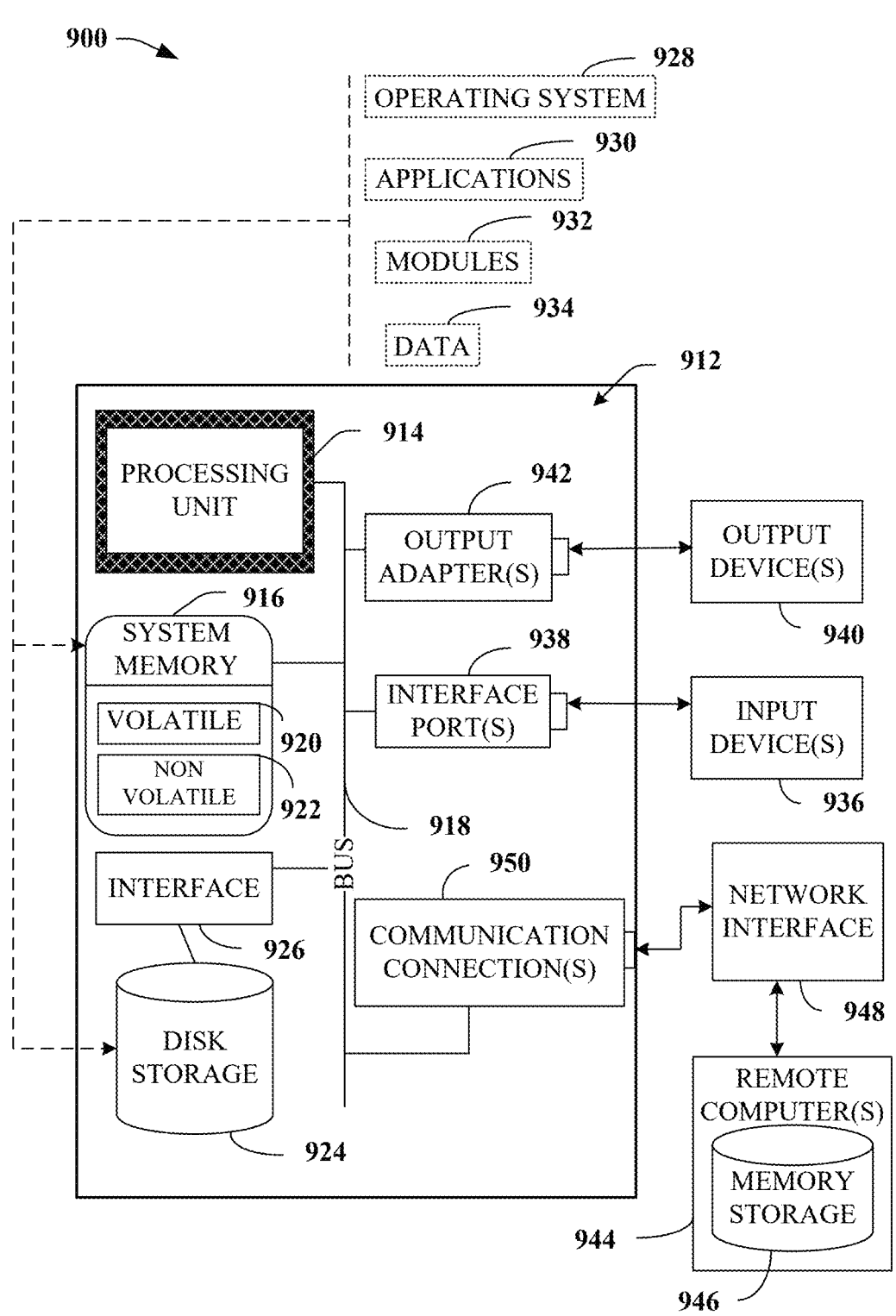
FIG. 9 illustrates a block diagram representing an illustrative non-limiting computing system or operating environment in which one or more aspects of various embodiments described herein can be implemented.

In order to provide a context for the various aspects of the disclosed subject matter, FIG. 9, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 9, a block diagram of a computing system 900 operable to execute the disclosed systems and methods, e.g., via system environment (100), is illustrated, in accordance with an embodiment. Computer 912 comprises a processing unit 914, a system memory 916, and a system bus 918. System bus 918 couples system components comprising, but not limited to, system memory 916 to processing unit 914. Processing unit 914 can be any of various available processors. Dual microprocessors and other multiprocessor architectures also can be employed as processing unit 914.

System bus 918 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 916 comprises volatile memory 920 and nonvolatile memory 922. A basic input/output system (BIOS), containing routines to transfer information between elements within computer 912, such as during start-up, can be stored in nonvolatile memory 922. By way of illustration, and not limitation, nonvolatile memory 922 can comprise ROM, PROM, EPROM, EEPROM, or flash memory. Volatile memory 920 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 912 also comprises removable/non-removable, volatile/non-volatile computer storage media. FIG. 9 illustrates, for example, disk storage 924. Disk storage 924 comprises, but is not limited to, devices like a magnetic disk drive, floppy disk drive, tape drive, Jaz drive, Zip drive, LS-100 drive, flash memory card, or memory stick. In addition, disk storage 924 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to system bus 918, a removable or non-removable interface is typically used, such as interface 926.

It is to be appreciated that FIG. 9 describes software that acts as an intermediary between users, e.g., subscribers, and computer resources described in suitable operating environment 900. Such software comprises an operating system 928. Operating system 928, which can be stored on disk storage 924, acts to control and allocate resources of computer system 912. System applications 930 take advantage of the management of resources by operating system 928 through program modules 932 and program data 934 stored either in system memory 916 or on disk storage 924. It is to be appreciated that the disclosed subject matter can be implemented with various operating systems or combinations of operating systems.

A user, e.g., subscriber, can enter commands or information into computer 912 through input device(s) 936. Input devices 936 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 914 through system bus 918 via interface port(s) 938. Interface port(s) 938 comprise, for example, a serial port, a parallel port, a game port, a universal serial bus (USB), a wireless based port, e.g., Wi-Fi, Bluetooth, etc. Output device(s) 940 use some of the same type of ports as input device(s) 936.

Thus, for example, a USB port can be used to provide input to computer 912 and to output information from computer 912 to an output device 940. Output adapter 942 is provided to illustrate that there are some output devices 940, like display devices, light projection devices, monitors, speakers, and printers, among other output devices 940, which use special adapters. Output adapters 942 comprise, by way of illustration and not limitation, video and sound devices, cards, etc. that provide means of connection between output device 940 and system bus 918. It should be noted that other devices and/or systems of devices provide both input and output capabilities such as remote computer(s) 944.

Computer 912 can operate in a networked environment using logical connections to one or more remote computers, such as remote computer(s) 944. Remote computer(s) 944 can be a personal computer, a server, a router, a network PC, a workstation, a microprocessor based appliance, a peer device, or other common network node and the like, and typically comprises many or all of the elements described relative to computer 912.

For purposes of brevity, only a memory storage device 946 is illustrated with remote computer(s) 944. Remote computer(s) 944 is logically connected to computer 912 through a network interface 948 and then physically and/or wirelessly connected via communication connection 950. Network interface 948 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 950 refer(s) to hardware/software employed to connect network interface 948 to bus 918. While communication connection 950 is shown for illustrative clarity inside computer 912, it can also be external to computer 912. The hardware/software for connection to network interface 948 can comprise, for example, internal and external technologies such as modems, comprising regular telephone grade modems, cable modems and DSL modems, wireless modems, ISDN adapters, and Ethernet cards.

The computer 912 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 912 can connect to other devices/networks by way of antenna, port, network interface adaptor, wireless access point, modem, and/or the like.

The computer 912 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth wireless technologies. Thus, the communication can be a predefined structure as with a conventional network or simply an ad hoc communication between at least two devices.

Wi-Fi allows connection to the Internet from a desired location (e.g., a vehicle, couch at home, a bed in a hotel room, or a conference room at work, etc.) without wires. Wi-Fi is a wireless technology similar to that used in a cell phone that enables such devices, e.g., mobile phones, computers, etc., to send and receive data indoors and out, anywhere within the range of a base station. Wi-Fi networks use radio technologies called IEEE 802.11 (a, b, g, etc.) to provide secure, reliable, fast wireless connectivity. A Wi-Fi network can be used to connect communication devices (e.g., mobile phones, computers, etc.) to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:

at least one processor; and at least one memory that stores executable instructions that, when executed by the at least one processor, facilitate performance of operations by the system, the operations comprising:

generating first identification data to be transmitted from the system via a power connection between the system and a power source, wherein the first identification data references a first unique identification corresponding to a first power supply of the system; and in response to receiving, via the power connection, a data transmission comprising second identification data referencing a second unique identification corresponding to a second power supply of the system, determining a lack of redundancy in power that has been supplied to the system.

2. The system of claim 1, wherein the second identification data is obtained from the second power supply.

3. The system of claim 1, wherein the receiving of the data transmission comprises:

receiving the data transmission via demodulation of a load of the system;

based on a defined frequency that is different from a power frequency of the power that has been supplied to the system, receiving the data transmission; or receiving the data transmission utilizing a broadband over power line-based communication protocol.

4. The system of claim 1, wherein the power source supplies, via the power connection, a first portion of the power to the first power supply, and wherein the determining of the lack of redundancy in power comprises:

in response to the data transmission being determined to comprise the second identification data referencing the second unique identification corresponding to the second power supply, determining that the power source supplies, via the power connection, a second portion of the power to the second power supply.

5. The system of claim 1, wherein the operations further comprise:

sending an indication of the lack of redundancy in power that has been supplied to the system directed to a device to facilitate a correction of the lack of redundancy in power.

6. The system of claim 5, wherein the sending of the indication comprises:

sending a message comprising the second identification data referencing the second unique identification corresponding to the second power supply directed to the device to facilitate the correction of the lack of redundancy in power.

7. The system of claim 5, wherein the power source is a first power source, wherein the power connection is a first power connection, wherein the power is first power, and wherein the operations further comprise:

performing the correction of the lack of redundancy in power by supplying, by a second power source that is different from the first power source, second power to the first power supply via a second power connection that is different from the first power connection, or supplying, by the second power source, the second power to the second power supply via the second power connection, wherein the second power connection is between the second power source and the first power supply or the second power supply.

8. The system of claim 1, wherein the determining of the lack of redundancy in power is a first determining of the lack of redundancy in power, and wherein the operations further comprise:

transmitting, via the power connection, the first identification data directed to the second power supply; and in response to receiving, via the power connection, a reply to the transmitting of the first identification data comprising the second identification data referencing the second unique identification corresponding to the second power supply, second determining the lack of redundancy in power that has been supplied to the system.

9. The system of claim 8, wherein the power source supplies, via the power connection, a first portion of the power to the first power supply, and wherein the second determining of the lack of redundancy in power comprises:

in response to the reply to the transmitting of the first identification data being determined to comprise the second identification data referencing the second unique identification corresponding to the second power supply, determining that the power source supplies, via the power connection, a second portion of the power to the second power supply.

10. The system of claim 8, wherein the transmitting of the first identification data comprises:

modulating a load of the system to perform the transmitting of the first identification data;

based on a defined frequency that is different from a power frequency of the power that has been supplied to the system, transmitting the first identification data; or transmitting the first identification data utilizing a broadband over power line-based communication protocol.

11. A method, comprising:

generating, by a system comprising at least one processor, a first unique identification corresponding to a first power supply of the system;

receiving, by the system via a power connection between the system and a power source, a data transmission;

determining, by the system, whether the data transmission comprises a second unique identification corresponding to a second power supply of the system; and in response to the data transmission being determined to comprise the second unique identification corresponding to the second power supply of the system, determining, by the system, a lack of redundancy in power that has been supplied to the system.

12. The method of claim 11, wherein the receiving of the data transmission comprises:

receiving the data transmission via demodulation of a load of the system;

based on a defined frequency that is different from a power frequency of the power that has been supplied to the system, receiving the data transmission; or receiving the data transmission utilizing a broadband over power line-based communication protocol.

13. The method of claim 11, further comprising:

in response to the determining of the lack of redundancy in power that has been supplied to the system, sending, by the system, a message directed to a device indicating the lack of redundancy in power that has been supplied to the system.

14. The system of claim 11, wherein the power source supplies, via the power connection, a first portion of the power to the first power supply, and wherein the determining of the lack of redundancy in power comprises:

in response to the data transmission being determined to comprise the second identification data referencing the second unique identification corresponding to the second power supply, determining that the power source supplies, via the power connection, a second portion of the power to the second power supply.

15. A method of claim 11, wherein the determining of the lack of redundancy in power is a first determining of the lack of redundancy in power, and wherein the method further comprises:

transmitting, by the system via the power connection, the first unique identification directed to the second power supply of the system;

determining, by the system, whether a reply to the transmitting of the first unique identification has been received via the power connection;

in response to the reply being determined to have been received via the power connection, determining, by the system, whether the reply comprises the second unique identification corresponding to the second power supply of the system; and in response to the reply being determined to comprise the second unique identification corresponding to the second power supply of the system, second determining, by the system, the lack of redundancy in power that has been supplied to the system.

16. The method of claim 15, wherein the power source supplies, via the power connection, a first portion of the power to the first power supply, and wherein the second determining of the lack of redundancy in power comprises:

in response to the reply being determined to comprise the second identification corresponding to the second power supply of the system, determining that the power source supplies, via the power connection, a second portion of the power to the second power supply.

17. The method of claim 15, wherein the transmitting of the first unique identification comprises:

modulating a load of the system to perform the transmitting of the first unique identification;

based on a defined frequency that is different from a power frequency of the power that has been supplied to the system, performing the transmitting of the first unique identification; or transmitting the first unique identification utilizing a broadband over power line-based communication protocol.

18. The method of claim 15, further comprising:

receiving, by the system via the power connection, the reply via demodulation of a load of the system;

receiving, by the system via the power connection, the reply based on a defined frequency that is different from a power frequency of the power that has been supplied to the system; or receiving, by the system via the power connection, the reply utilizing a broadband over power line-based communication protocol.

19. A non-transitory machine-readable medium comprising instructions that, in response to execution, cause a system comprising at least one processor to perform operations, the operations comprising:

generating first data representing the system or a first power supply of the system; and in response to receiving, via a power connection between a power source and the system, second data representing a second power supply of the system, determining a lack of redundancy in power that has been supplied to the system, wherein the determining of the lack of redundancy in power comprises determining, based on the second data, that the power source supplies, via the power connection, a first portion of the power to the first power supply of the system and a second portion of the power to the second power supply of the system.

20. The non-transitory machine-readable medium of claim 19, wherein the determining of the lack of redundancy in power is a first determining of the lack of redundancy in power, and wherein the operations further comprise:

transmitting, via a transmission using the power connection, the first data directed to the second power supply of the system; and in response to a response to the transmission of the first data comprising the second data being determined to be received, second determining the lack of redundancy in power that has been supplied to the system, wherein the second determining of the lack of redundancy in power comprises determining, based on the second data, that the power source supplies, via the power connection, the first portion of the power to the first power supply of the system and the second portion of the power to the second power supply of the system.

* * * * *